(12) United States Patent
Hatazaki et al.

(10) Patent No.: US 10,748,761 B2
(45) Date of Patent: Aug. 18, 2020

(54) SEMICONDUCTOR MANUFACTURING APPARATUS AND METHOD FOR MANUFACTURING SEMICONDUCTOR DEVICE

(71) Applicant: TOSHIBA MEMORY CORPORATION, Minato-ku, Tokyo (JP)

(72) Inventors: Akitsugu Hatazaki, Yokkaichi Mie (JP); Kotaro Nomura, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/290,684

(22) Filed: Mar. 1, 2019

(65) Prior Publication Data
US 2020/0075326 A1 Mar. 5, 2020

(30) Foreign Application Priority Data
Sep. 5, 2018 (JP) .................................. 2018-166074

(51) Int. Cl.
*H01L 21/00* (2006.01)
*H01L 29/00* (2006.01)
(Continued)

(52) U.S. Cl.
CPC .... *H01L 21/02348* (2013.01); *H01L 21/0217* (2013.01); *H01L 21/0228* (2013.01);
(Continued)

(58) Field of Classification Search
CPC ......... H01L 21/02348; H01L 21/02164; H01L 21/0217; H01L 21/0228; H01L 21/67115; H01L 21/67011; H01L 21/02345; H01L 29/7843; H01L 29/517; H01L 29/458; H01L 29/40114; H01L 29/66969
See application file for complete search history.

(56) References Cited

U.S. PATENT DOCUMENTS 6,236,475 B1 * 5/2001 Kihara ..................... G03H 1/04
359/22
8,753,989 B2 6/2014 Balseanu et al.
(Continued)

FOREIGN PATENT DOCUMENTS

| JP | S61-190337 A | 8/1986 |
|----|--------------|--------|
| JP | 2010-186815 A | 8/2010 |
| JP | 2011-011357 A | 1/2014 |

*Primary Examiner* — Nikolay K Yushin
(74) *Attorney, Agent, or Firm* — Foley & Lardner LLP (57) ABSTRACT

A semiconductor manufacturing apparatus includes at least one UV lamp provided at a position facing a surface of a semiconductor substrate arranged to irradiate the surface of the semiconductor substrate with UV light, and a shutter disposed between the surface of the semiconductor substrate and the at least one UV lamp and configured to block UV light emitted by the UV lamp. The shutter includes a first movable part movable in a first direction being an in-plane direction parallel to the semiconductor substrate, and a second movable part movable in a second direction being an in-plane direction perpendicular to the first direction, the second movable part being movable independently of the first movable part.

16 Claims, 5 Drawing Sheets

(51) Int. Cl.
*H01L 21/02* (2006.01)
*H01L 29/78* (2006.01)
*H01L 21/67* (2006.01)

(52) U.S. Cl.
CPC .. *H01L 21/02164* (2013.01); *H01L 21/67115* (2013.01); *H01L 29/7843* (2013.01)

(56) References Cited

U.S. PATENT DOCUMENTS

| | | | |
|---|---|---|---|
| 8,853,100 | B2 | 10/2014 | Igeta et al. |
| 9,059,226 | B2 * | 6/2015 | Muramoto ........ H01L 21/67742 |
| 2009/0085256 | A1 * | 4/2009 | Mataki .................... B41M 5/00 |
| | | | 264/401 |
| 2011/0146705 | A1 | 6/2011 | Hart et al. |
| 2012/0234364 | A1 * | 9/2012 | Muramoto ........ H01L 21/67742 |
| | | | 134/104.1 |

\* cited by examiner

SEMICONDUCTOR MANUFACTURING APPARATUS AND METHOD FOR MANUFACTURING SEMICONDUCTOR DEVICE

CROSS-REFERENCE TO RELATED APPLICATION

This application is based upon and claims the benefit of priority from Japanese Patent Application No. 2018-166074, filed Sep. 5, 2018, the entire contents of which are incorporated herein by reference.

FIELD

Embodiments described herein relate generally to a semiconductor manufacturing apparatus and a method for manufacturing a semiconductor device.

BACKGROUND

With regard to a three-dimensional semiconductor memory, an example of a semiconductor device, the amount of warpage of a semiconductor substrate (wafer) increases with increase in the number of layers in the surface of the semiconductor substrate. A technique which involves forming, for example, a silicon nitride (SiN) film on the back surface of a semiconductor substrate is known as a method to reduce warpage of the semiconductor substrate.

DETAILED DESCRIPTION

Variation in the amount of warpage of a semiconductor substrate in an in-plane direction cannot be improved by merely forming the above-described silicon nitride film on the back surface of the semiconductor substrate.

Embodiments provide a semiconductor manufacturing apparatus and a method for manufacturing a semiconductor device which can reduce variation in the amount of warpage of a semiconductor substrate.

In general, according to at least one embodiment, a semiconductor manufacturing apparatus comprises at least one UV lamp provided at a position facing a surface of a semiconductor substrate which is to be irradiated with UV light, and a shutter disposed between the surface of the semiconductor substrate and the at least one UV lamp and which is capable of blocking UV light emitted by the UV lamp. The shutter includes a first movable part which is movable in a first direction, an in-plane direction parallel to the semiconductor substrate, and a second movable part which is movable in a second direction, an in-plane direction perpendicular to the first direction, independently of the first movable part.

Embodiments of the present disclosure will now be described with reference to the drawings. The embodiments are not to be construed as limiting the present disclosure.

First Embodiment

Figure 1:
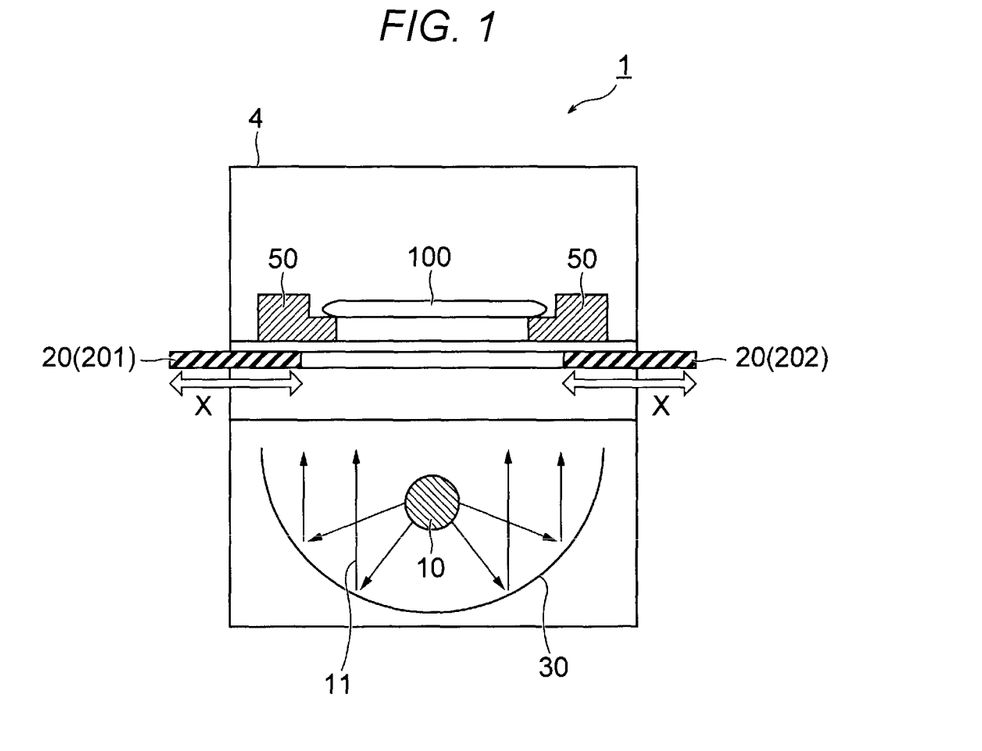
FIG. 1 is a side view schematically showing the structure of a semiconductor manufacturing apparatus according to a first embodiment.

FIG. 1 is a side view schematically showing the structure of a semiconductor manufacturing apparatus according to a first embodiment. The semiconductor manufacturing apparatus 1 shown in FIG. 1 includes a UV lamp 10, a shutter 20, a reflector 30, a chamber 4, and a support 50. The semiconductor manufacturing apparatus 1 is an apparatus for irradiating a semiconductor device 100 in a wafer state with UV light. At the outset, the structure of the semiconductor device 100 will be described.

Figure 2:
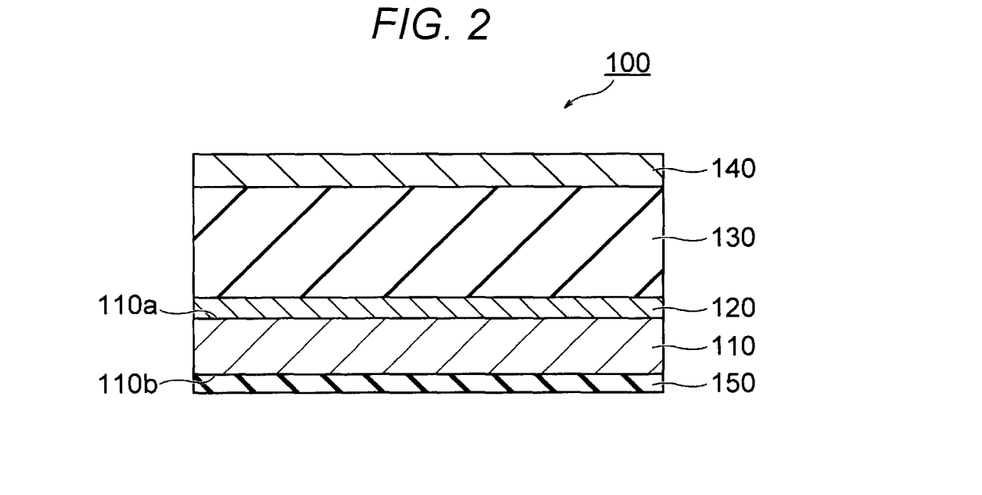
FIG. 2 is a cross-sectional side view showing a schematic structure of a semiconductor device.

FIG. 2 is a cross-sectional side view showing a schematic structure of the semiconductor device 100. As shown in FIG. 2, the semiconductor device 100 includes a semiconductor substrate 110 such as a silicon substrate. An underlayer 120, a multilayer part 130 and an interconnect layer 140 are stacked on the front surface 110a of the semiconductor substrate 110.

Drive elements, etc. are formed in the underlayer 120. In the multilayer part 130, conductive layers and insulating layers are stacked alternately. A plurality of memory cells (not shown), which are driven by the drive elements, are formed in a hole (not shown) that penetrates the multilayer part 130. Interconnects, etc. for selecting memory cells are formed in the interconnect layer 140.

A silicon nitride film 150 is formed on the back surface 110b of the semiconductor substrate 110. The silicon nitride film 150 functions as a film that reduces warpage of the semiconductor device 100.

The construction of the semiconductor manufacturing apparatus 1 according to this embodiment will now be described with reference to FIG. 1. In the semiconductor manufacturing apparatus 1, the annular support 50 supports the above-described semiconductor device 100 in the chamber 4 in a vacuum condition.

The UV lamp 10 for emitting UV light 11 is provided below the back surface 110b of the semiconductor substrate 110. The reflector 30 is disposed around the UV lamp 10.

The UV light 11 emitted by the UV lamp 10 reflects from the reflector 30. The reflected UV light 11 travels toward the silicon nitride film 150 formed on the back surface 110b of the semiconductor substrate 110. The use of the reflector 30 in this embodiment allows the silicon nitride film 150 to be irradiated with a uniform irradiation amount of the UV light 11.

The shutter 20 for blocking the UV light 11 is provided between the back surface 110b of the semiconductor substrate 110 and the UV lamp 10. The structure of the shutter 20 will now be described with reference to FIG. 3.

Figure 3:
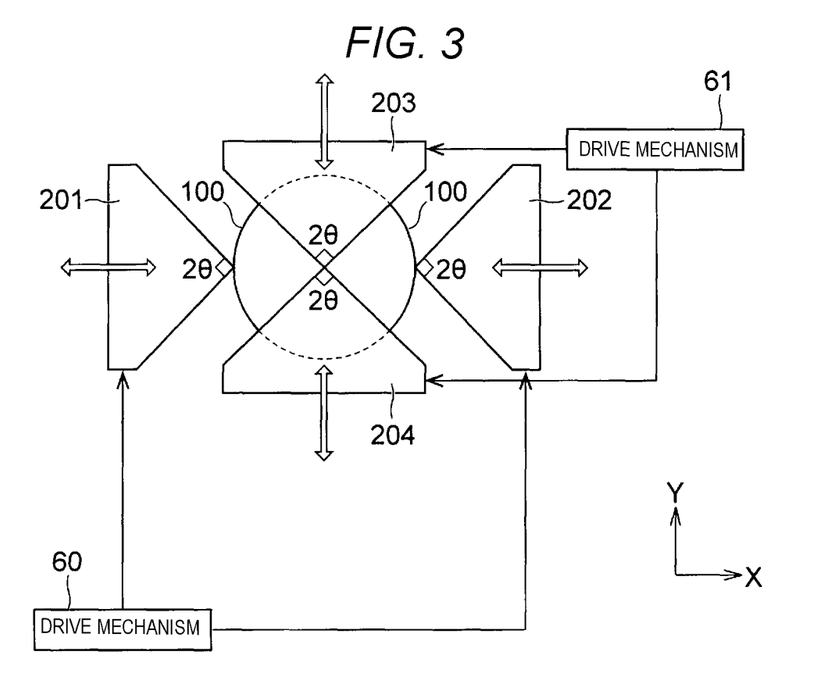
FIG. 3 is a plan view of a shutter according to the first embodiment.

FIG. 3 is a plan view of the shutter 20. The shutter 20 of this embodiment includes a pair of movable parts 201, 202 corresponding to first movable parts, and a pair of movable parts 203, 204 corresponding to second movable parts.

The movable part 201 and the movable part 202 face each other in an X-axis direction. The movable part 201 and the movable part 202 are movable by a drive mechanism 60 in the X-axis direction. The X-axis direction is an example of a first direction which is an in-plane direction parallel to the back surface 110b of the semiconductor substrate 110.

On the other hand, the movable part 203 and the movable part 204 face each other in a Y-axis direction. The movable part 203 and the movable part 204 are movable by a drive mechanism 61 in the Y-axis direction independently of the movable part 201 and the movable part 202. The Y-axis direction is perpendicular to the X-axis direction and is an example of a second direction which is an in-plane direction perpendicular to the first direction.

Figure 4:
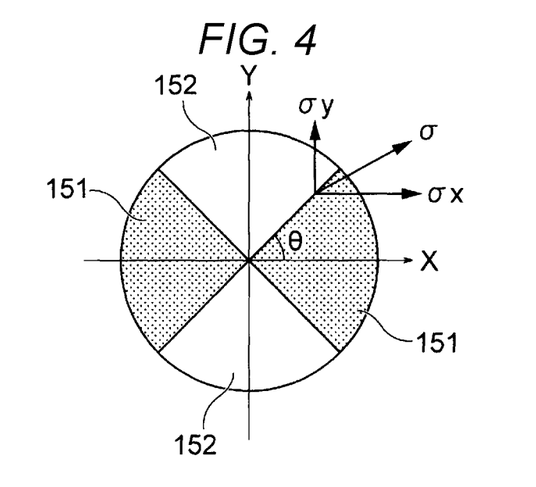
FIG. 4 is a plan view showing a UV irradiation area and a UV non-irradiation area according to the first embodiment.

In FIG. 3, the movable part 201 and the movable part 202 are disposed away from the semiconductor device 100, while the movable part 203 and the movable part 204 are disposed such that they cover the semiconductor device 100. In this case, as shown in FIG. 4, fan-shaped UV irradiation areas 151 are set on the silicon nitride film 150 in the X-axis direction, and fan-shaped UV non-irradiation areas 152 are set on the silicon nitride film 150 in the Y-axis direction. The UV irradiation areas 151 are those areas which are to be irradiated with the UV light 11 emitted by the UV lamp 10. On the other hand, the UV non-irradiation areas 152 are those areas which are to be shielded from the UV light 11 by the movable part 203 and the movable part 204.

In the semiconductor device 100, as the thickness of the multilayer part 130 increases with increase in the memory capacity, the semiconductor substrate 110 is more likely to warp in a concave shape. In other words, the semiconductor substrate 110 is more likely to deform into a downward-convex shape. By forming the silicon nitride film 150 on the back surface 110b of the semiconductor substrate 110, a tensile stress acts on the semiconductor substrate 110. This can reduce warpage of the semiconductor substrate 110.

When the silicon nitride film 150 is one which has been formed by a plasma CVD (Chemical Vapor Deposition) method, the concentration of hydrogen contained in the silicon nitride film 150 is reduced by the UV light 11. As a result, a higher tensile stress acts on the UV irradiation areas 151 than that acting on the UV non-irradiation areas 152. Thus, when the amount of warpage of the semiconductor substrate 110 in the X-axis direction is larger than that in the Y-axis direction, the movable parts are positioned as shown in FIG. 3. Consequently, the UV irradiation areas 151 of the silicon nitride film 150 are set along the X-axis direction as shown in FIG. 4. This reduces the difference between the amount of warpage in the X-axis direction and the amount of warpage in the Y-axis direction.

As shown in FIG. 4, a stress $\sigma$ that acts on the silicon nitride film 150 at a position which forms the angle $\theta$ with the X-axis direction can be decomposed into the X-axis direction stress $\sigma x = \sigma \cos \theta$ and the Y-axis direction stress $\sigma y = \sigma \sin \theta$. The amount of warpage in the X-axis direction depends on the X-axis direction stress $\sigma x$, and the amount of warpage in the Y-axis direction depends on the Y-axis direction stress $\sigma y$. Therefore, in order to minimize the difference in the amount of warpage between the X-axis direction and the Y-axis direction, the angle $\theta$ is preferably 45 degrees ($\pi/4$).

In this embodiment the shutter 20 includes the movable parts 201 to 204 which are quarterly divided in the circumferential direction of the semiconductor substrate 110 and which each have a triangular top portion. The angle of the top portion, i.e. the vertex angle of the triangle, is equal to $2\theta$. Thus, in order to minimize the difference in the amount of warpage between the X-axis direction and the Y-axis direction, the angle of the top portion of each of the movable parts 201 to 204 is preferably 90 degrees.

A method for manufacturing the semiconductor device 100 will now be described. First, as shown in FIG. 2, an underlayer 120, a multilayer part 130 and an interconnect layer 140 are sequentially formed on the front surface 110a of a semiconductor substrate 110.

After the formation of the multilayer part 130 or after the formation of the interconnect layer 140, warpage of the semiconductor substrate 110 is measured for the X-axis direction and the Y-axis direction. The measurement of warpage of the semiconductor substrate 110 may be performed e.g. by irradiating the back surface 110b with laser light.

Next, a silicon nitride film 150 is formed by a plasma CVD method on the entire back surface 110b of the semiconductor substrate 110. The thickness of the silicon nitride film 150 has been set based on the results of the measurement of warpage of the semiconductor substrate 110.

Subsequently, the movable parts 201 to 204 of the shutter 20 are positioned based on the results of the measurement of warpage of the semiconductor substrate 110. When the amount of warpage in the X-axis direction is larger than the amount of warpage in the Y-axis direction, the movable part 201 and the movable part 202 are positioned away from the semiconductor device 100, while the movable part 203 and the movable part 204 are positioned such that they face the semiconductor device 100 (see FIG. 3). Consequently, UV irradiation areas 151 are set on the silicon nitride film 150 in the X-axis direction, and UV non-irradiation areas 152 are set on the silicon nitride film 150 in the Y-axis direction (see FIG. 4).

To the contrary, when the amount of warpage in the X-axis direction is smaller than the amount of warpage in the Y-axis direction, the movable part 201 and the movable part 202 are located such that they face the semiconductor device 100, while the movable part 203 and the movable part 204 are located away from the semiconductor device 100. Consequently, UV non-irradiation areas 152 are set on the silicon nitride film 150 in the X-axis direction, and UV irradiation areas 151 are set on the silicon nitride film 150 in the Y-axis direction.

Lastly, the UV lamp 10 emits UV light 11. The UV light 11 is applied only to the UV irradiation areas 151 of the silicon nitride film 150. The UV irradiation reduces the difference in the amount of warpage of the semiconductor substrate 110 between the X-axis direction and the Y-axis direction.

According to the above-described embodiment, the use of the movable parts 201 to 204 of the shutter 20 allows selection of the area to be irradiated with the UV light 11 on the silicon nitride film 150. This makes it possible to locally adjust a stress that acts on the semiconductor substrate 110, thereby reducing variation in the amount of warpage of the semiconductor substrate 110.

Second Embodiment

A second embodiment will now be described, focusing on a difference from the first embodiment. This embodiment differs from the first embodiment in the shape of the shutter.

Figure 5:
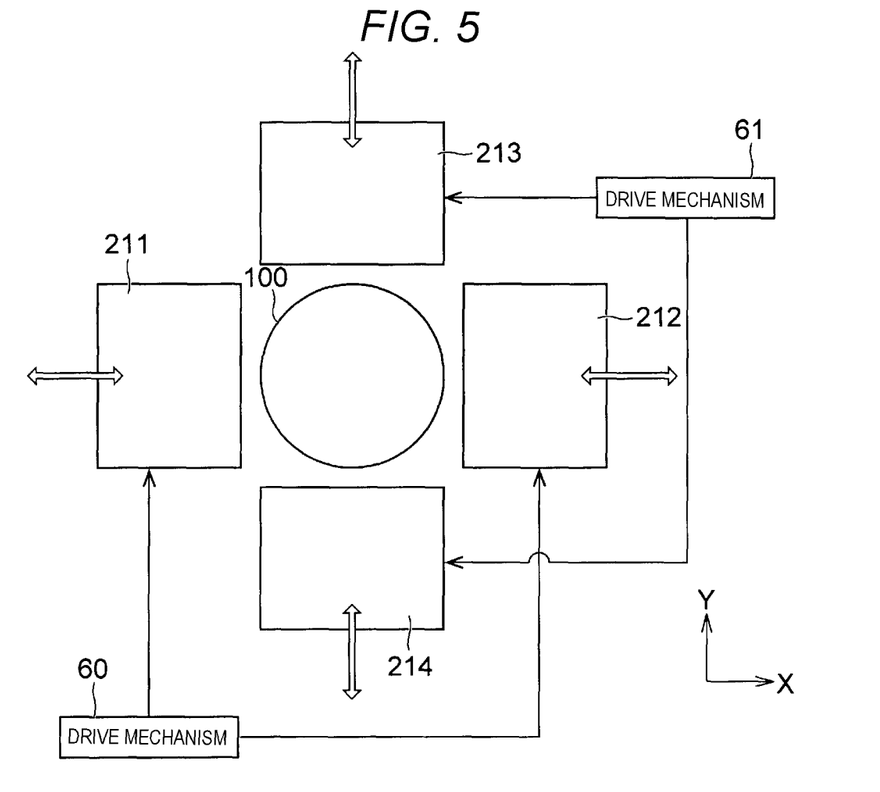
FIG. 5 is a plan view of a shutter according to a second embodiment.

FIG. 5 is a plan view of the shutter according to the second embodiment. The shutter shown in FIG. 5 includes a pair of movable parts 211, 212 corresponding to first movable parts, and a pair of movable parts 213, 214 corresponding to second movable parts.

The movable part 211 and the movable part 212 have a quadrangular shape and face each other in the X-axis direction. The movable part 211 and the movable part 212 are movable by the drive mechanism 60 in the X-axis direction.

On the other hand, the movable part 213 and the movable part 214 also have a quadrangular shape and face each other in the Y-axis direction. The movable part 213 and the movable part 214 are movable by the drive mechanism 61 in the Y-axis direction independently of the movable part 211 and the movable part 212.

Figure 6:
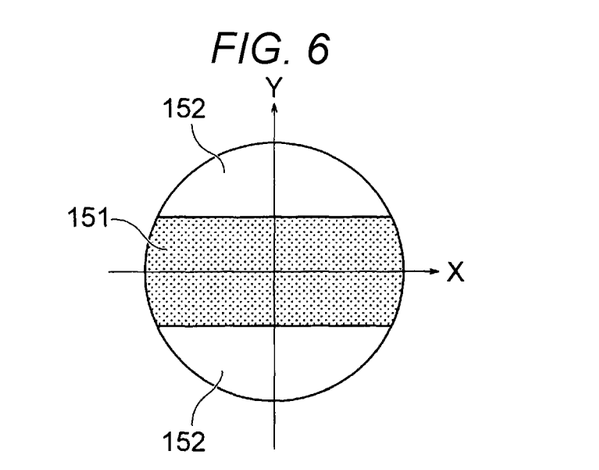
FIG. 6 is a plan view showing a UV irradiation area and a UV non-irradiation area according to the second embodiment.

When, for example, the amount of warpage of the semiconductor substrate 110 in the X-axis direction is larger than that in the Y-axis direction, the movable part 211 and the movable part 212 are disposed away from the semiconductor device 100, while the movable part 213 and the movable part 214 are disposed such that they cover the semiconductor device 100. Accordingly, as shown in FIG. 6, a zonal UV irradiation area 151 extending in the X-axis direction and arcuate UV non-irradiation areas 152, located on opposite sides of the UV irradiation area 151 and opposite each other in the Y-axis direction, are set on the silicon nitride film 150.

As in the first embodiment, the UV irradiation area 151 is irradiated with UV light 11 from the UV lamp 10; therefore, a higher tensile stress acts on the UV irradiation areas 151 than that acting on the UV non-irradiation areas 152. This reduces the difference in the amount of warpage of the semiconductor substrate 110 between the X-axis direction and the Y-axis direction.

According to the second embodiment described above, the use of the movable parts 211 to 214 allows selection of a zonal UV irradiation area 151 on the silicon nitride film 150. Therefore, the second embodiment also makes it possible to locally adjust a stress that acts on the semiconductor substrate 110, thereby reducing variation in the amount of warpage of the semiconductor substrate 110.

Third Embodiment

Figure 7:
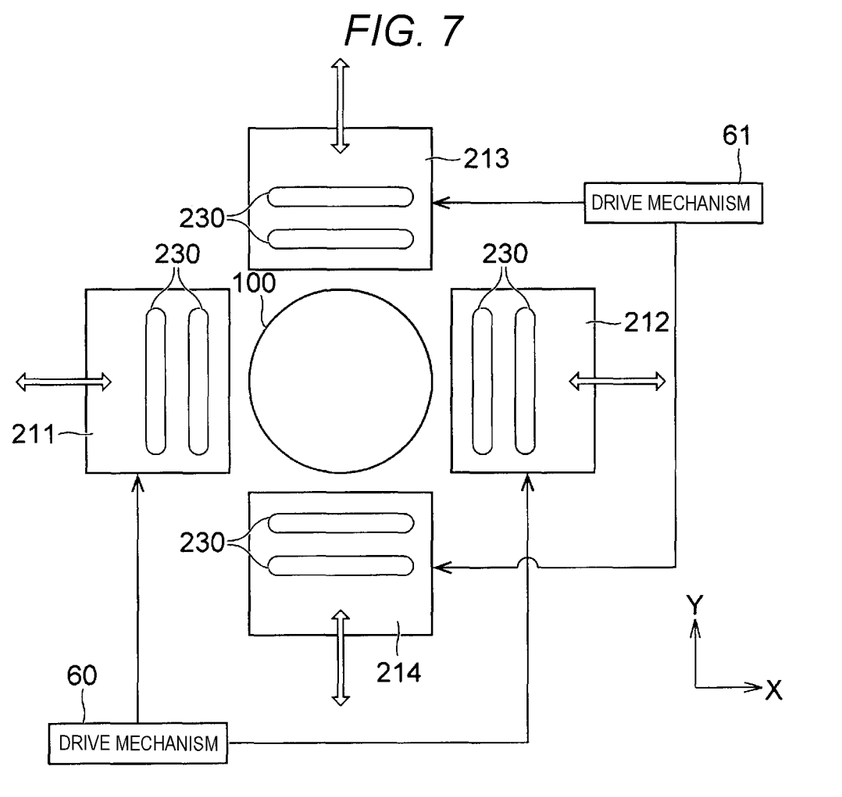
FIG. 7 is a plan view of a shutter according to a third embodiment.

FIG. 7 is a plan view of a shutter according to a third embodiment. The third embodiment will now be described, focusing on a difference from the second embodiment. In the shutter shown in FIG. 7, the movable parts 211 to 214, described above with reference to the second embodiment, each have windows 230.

The windows 230 transmit the UV light 11 emitted by the UV lamp 10. Though in this embodiment the windows 230 are provided in all the movable parts, a window(s) may be provided in at least one of the movable parts. Though in this embodiment each movable part has two windows 230, there is no particular limitation on the number of windows 230.

Figure 8:
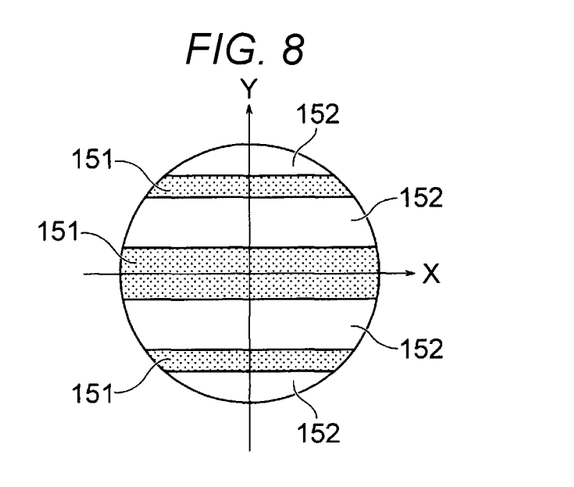
FIG. 8 is a plan view showing a UV irradiation area and a UV non-irradiation area according to the third embodiment.

Assume that the movable part 211 and the movable part 212 are disposed away from the semiconductor device 100, while the movable part 213 and the movable part 214 are disposed such that they cover the semiconductor device 100. Since the windows 230 provided in the movable part 213 and the movable part 214 transmit the UV light 11, UV irradiation areas 151 and UV non-irradiation areas 152 are set in a stripe pattern on the silicon nitride film 150 as shown in FIG. 8.

According to the third embodiment described above, the windows 230 provided in the movable parts 211 to 214 can set UV irradiation areas 151 in a stripe pattern on the silicon nitride film 150. Therefore, the third embodiment also makes it possible to locally adjust a stress that acts on the semiconductor substrate 110, thereby reducing variation in the amount of warpage of the semiconductor substrate 110.

Fourth Embodiment

Figure 9:
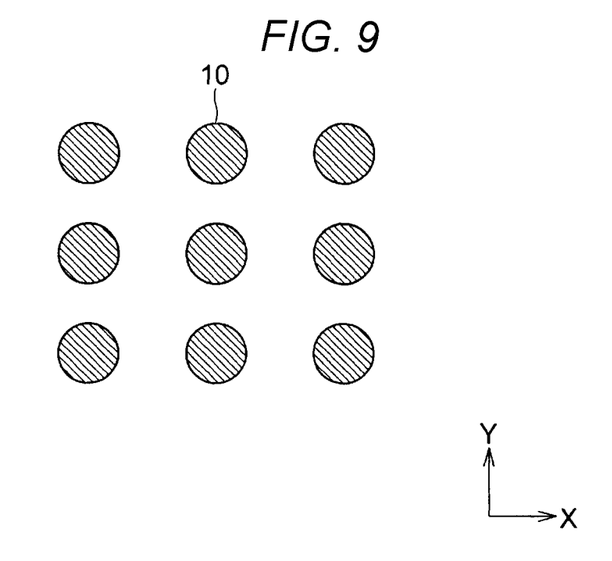
FIG. 9 is a plan view of UV lamps according to a fourth embodiment.

FIG. 9 is a plan view of UV lamps according to a fourth embodiment. In the above-described semiconductor manufacturing apparatus 1 according to the first embodiment, UV light 11 from the single UV lamp 10 is reflected by the reflector 30, and the silicon nitride film 150 is irradiated with the reflected light.

On the other hand, in this embodiment a plurality of UV lamps 10 are arranged in a matrix form in the X-axis and Y-axis directions. All the UV lamps 10 simultaneously emit UV light 11 toward the silicon nitride film 150. Therefore, it is not necessary to use the reflector 30.

According to the fourth embodiment described above, the silicon nitride film 150 can be irradiated with a uniform irradiation amount of the UV light 11 even without use of the reflector 30.

[Variation]

Figure 10:
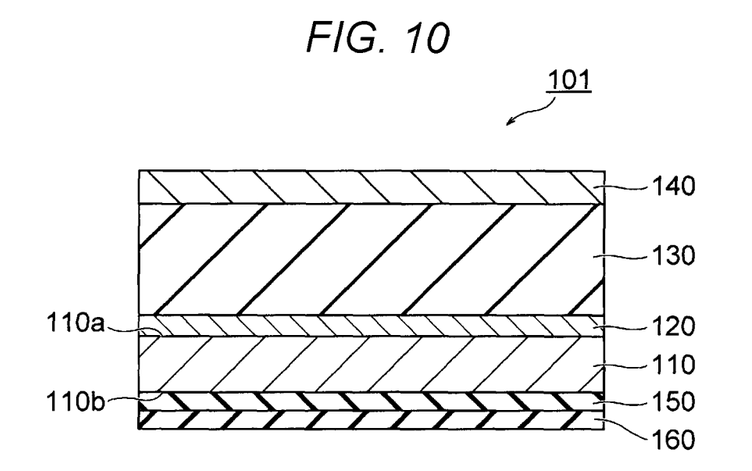
FIG. 10 is a cross-sectional view showing a schematic structure of a semiconductor device according to a variation.

FIG. 10 is a cross-sectional view showing the structure of a semiconductor device according to a variation. In FIG. 10 and in the following description, the same reference symbols as used for the semiconductor device 100 shown in FIG. 2 are used to refer to the same or equivalent components or elements, and a detailed description thereof will be omitted.

In the first to fourth embodiments described above, the silicon nitride film 150 is formed on the back surface 110b of the semiconductor substrate 110, and the UV irradiation area (s) 151 of the silicon nitride film 150 is irradiated with the UV light 11. The UV irradiation increases a tensile stress that acts on the semiconductor substrate 110 and can thereby reduce the difference in the amount of warpage of the semiconductor substrate 110 between the X-axis direction and the Y-axis direction. On the other hand, it is possible that the semiconductor substrate 110 may deform into an upward-convex shape.

In view of this, in this variation a silicon nitride film 150 and a silicon oxide film 160 are stacked on the back surface 110b of the semiconductor substrate 110. The silicon oxide film 160 can be formed by using, for example, a CVD method or an ALD (Atomic Layer Deposition) method.

The silicon oxide film 160 causes a compressive stress to act on the semiconductor substrate 110, whereby the semiconductor substrate 110 returns from an upward-convex shape to a flat shape. In this embodiment, the formation of the silicon oxide film 160 is performed after the formation of the silicon nitride film 150; however, the formation of the silicon oxide film 160 may be performed before the formation of the silicon nitride film 150.

The above-described variation makes it possible to further reduce warpage of the semiconductor substrate 110.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing apparatus comprising:
at least one UV lamp provided at a position facing a surface of a semiconductor substrate, and arranged to irradiate the surface of the semiconductor substrate with UV light; and
a shutter disposed between the surface of the semiconductor substrate and the at least one UV lamp and configured to block UV light emitted by the at least one UV lamp, wherein the shutter includes
a first movable part movable in a first direction being an in-plane direction parallel to the semiconductor substrate, and
a second movable part movable in a second direction being an in-plane direction perpendicular to the first direction, the second movable part being movable independently of the first movable part.

2. The semiconductor manufacturing apparatus according to claim 1, wherein the first movable part and the second movable part each have a triangular top portion.

3. The semiconductor manufacturing apparatus according to claim 2, wherein the angle of the top portion is 90 degrees.

4. The semiconductor manufacturing apparatus according to claim 1, wherein the first movable part and the second movable part each have a quadrangular shape.

5. The semiconductor manufacturing apparatus according to claim 1,
wherein at least one of the first movable part or the second movable part includes at least one window transparent to the UV light.

6. The semiconductor manufacturing apparatus according to claim 5,
wherein the at least one window has a stripe shape.

7. The semiconductor manufacturing apparatus according to claim 1, wherein at least one UV lamp includes a plurality of UV lamps arranged in a matrix.

8. The semiconductor manufacturing apparatus according to claim 1, further comprising a mirror arranged to direct UV light received from the at least one UV lamp, and to direct the received UV light in a uniform manner to the surface of the semiconductor substrate.

9. The semiconductor manufacturing apparatus according to claim 1, further comprising at least one drive configured to drive the first movable part and the second movable part.

10. The semiconductor manufacturing apparatus according to claim 1, wherein the at least one drive includes a first drive configured to drive the first movable part, and a second drive configured to drive the second movable part independently of the first movable part.

11. The semiconductor manufacturing apparatus according to claim 1, wherein the first movable part and the second movable part each have a fan shape.

12. A method for manufacturing a semiconductor device, comprising:
forming a plurality of layers on a front surface of a semiconductor substrate;
forming a silicon nitride film on a back surface of the semiconductor substrate;
setting a UV irradiation area and a UV non-irradiation area on the silicon nitride film by using a shutter including a first movable part movable in a first direction being an in-plane direction parallel to the semiconductor substrate, and a second movable part movable in a second direction being an in-plane direction perpendicular to the first direction, the second movable part being movable independently of the first movable part; and
irradiating the UV irradiation area with UV light.

13. The method for manufacturing a semiconductor device according to claim 12, wherein the silicon nitride film and a silicon oxide film are stacked on the back surface of the semiconductor substrate.

14. The method for manufacturing a semiconductor device according to claim 12, wherein the UV irradiation area is fan shaped.

15. The method for manufacturing a semiconductor device according to claim 12, wherein the UV irradiation area is zonal shaped.

16. The method for manufacturing a semiconductor device according to claim 12, wherein the UV irradiation area is shaped as separated stripes.

* * * * *